US009363916B2

(12) United States Patent  
Perez-Uria et al.

(10) Patent No.: US 9,363,916 B2
(45) Date of Patent: Jun. 7, 2016

(54) CONNECTION PIN AND A METHOD FOR MOUNTING A CONNECTION PIN IN A COMPONENT CARRIER FOR AN ELECTRONIC ASSEMBLY, AND SUCH A COMPONENT CARRIER COMPRISING CONNECTION PINS

(75) Inventors: Igor Perez-Uria, Järfälla (SE); Ola Arvidsson, Kalmar (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 305 days.

(21) Appl. No.: 14/000,376

(22) PCT Filed: Feb. 25, 2011

(86) PCT No.: PCT/SE2011/050221
§ 371 (c)(1),
(2), (4) Date: Aug. 19, 2013

(87) PCT Pub. No.: WO2012/115554
PCT Pub. Date: Aug. 30, 2012

(65) Prior Publication Data
US 2013/0322045 A1 Dec. 5, 2013

(51) Int. Cl.
*H05K 7/06* (2006.01)
*H05K 3/30* (2006.01)
(Continued)

(52) U.S. Cl.
CPC ............... *H05K 7/06* (2013.01); *H01R 43/00* (2013.01); *H05K 3/301* (2013.01); *H05K 3/3447* (2013.01);
(Continued)

(58) Field of Classification Search
CPC ......... H01R 43/00; H05K 3/301; H05K 7/06; H05K 2201/1059; H05K 2201/10871; H05K 2201/10303; H05K 2201/2036
See application file for complete search history.

(56) References Cited

U.S. PATENT DOCUMENTS 2,814,024 A 11/1957 Narozny
3,123,664 A 3/1964 Logan et al.
(Continued)

FOREIGN PATENT DOCUMENTS

DE 44 22 876 A1 1/1995
GB 2 006 550 A 5/1979
(Continued)

OTHER PUBLICATIONS

Communication pursuant to Article 94(3) EPC, European Application No. 11 715 082.1, Mar. 24, 2015.
(Continued)

*Primary Examiner* — Hoa C Nguyen
*Assistant Examiner* — Keith Depew
(74) *Attorney, Agent, or Firm* — Patents on Demand, P.A.; Brian K. Buchheit; Scott M. Garrett

(57) ABSTRACT

A connection pin for mounting in a through-hole of a component carrier, comprising an anchoring part adapted for insertion into said through-hole with a non press fit, a contact part adapted to extend outside said through-hole, and a flange part adapted to abut against said component carrier and located between said anchoring part and said contact part. The anchoring part is provided an internal cavity and the anchoring part comprises a wall surrounding the internal cavity, which wall has at least two wall portions forming deformation zones and adapted to be located in the through-hole when the anchoring part is inserted in the through-hole, such that, upon exertion of a force on a free end of the anchoring part of the pin when the anchoring part is inserted in the through-hole, the deformation zones are deformed within the through-hole to press fit the connection pin in the through-hole.

12 Claims, 3 Drawing Sheets

(51) Int. Cl.
*H01R 43/00* (2006.01)
*H05K 3/34* (2006.01)

(52) U.S. Cl.
CPC ............... *H05K 2201/1059* (2013.01); *H05K 2201/10303* (2013.01); *H05K 2201/10871* (2013.01); *H05K 2203/0195* (2013.01); *Y10T 29/49218* (2015.01)

(56) References Cited

U.S. PATENT DOCUMENTS

| | | | |
|---|---|---|---|
| 3,233,034 A * | 2/1966 | Grabbe | 174/257 |
| 3,263,200 A * | 7/1966 | Kocmich | 439/73 |
| 3,416,122 A | 12/1968 | Kinkaid | |
| 3,428,934 A * | 2/1969 | Seitz, Jr. et al. | 439/876 |
| 3,832,603 A | 8/1974 | Cray et al. | |
| 3,860,323 A * | 1/1975 | Fischer et al. | 439/217 |
| 4,186,982 A | 2/1980 | Cobaugh et al. | |
| 4,200,900 A * | 4/1980 | McGeorge | 361/803 |
| 4,420,877 A | 12/1983 | McKenzie, Jr. | |
| 4,660,922 A | 4/1987 | Cooney et al. | |
| RE32,540 E | 11/1987 | Murphy | |
| 4,906,198 A | 3/1990 | Cosimano et al. | |
| 5,046,971 A | 9/1991 | Ruggiero et al. | |
| 5,456,608 A | 10/1995 | Rogers et al. | |
| 5,480,309 A | 1/1996 | Arisaka | |
| 5,796,588 A * | 8/1998 | Machida et al. | 361/773 |
| 5,915,999 A | 6/1999 | Takenaka et al. | |
| 6,168,441 B1 * | 1/2001 | Buchart | 439/82 |
| 6,217,346 B1 | 4/2001 | Cubon | |
| 6,384,341 B1 | 5/2002 | Rothermel et al. | |
| 6,545,890 B2 | 4/2003 | Pitzele | |
| 6,818,839 B2 | 11/2004 | Hosaka et al. | |
| 7,025,604 B2 | 4/2006 | Fronk | |
| 7,320,627 B2 * | 1/2008 | Skarlupka et al. | 439/863 |
| 7,377,823 B2 | 5/2008 | Chen | |
| 8,324,642 B2 | 12/2012 | Grajcar | |
| 2004/0137803 A1 * | 7/2004 | Pitzele | 439/884 |
| 2006/0193118 A1 * | 8/2006 | Ahmad et al. | 361/760 |
| 2007/0093143 A1 | 4/2007 | Nomura | |
| 2008/0207015 A1 | 8/2008 | Sueyoshi | |
| 2008/0265398 A1 | 10/2008 | Matsumoto et al. | |
| 2009/0175009 A1 * | 7/2009 | Pu | 361/760 |
| 2009/0298312 A1 | 12/2009 | Gueckel | |
| 2011/0207363 A1 | 8/2011 | Shimizu | |
| 2012/0088381 A1 | 4/2012 | Wild et al. | |
| 2012/0156898 A1 * | 6/2012 | Kallee | 439/65 |
| 2013/0330966 A1 | 12/2013 | Perez-Uria et al. | |

FOREIGN PATENT DOCUMENTS

| | | |
|---|---|---|
| JP | 6-84550 | 3/1994 |
| JP | 06084550 A | 3/1994 |
| WO | WO 2007/008264 A1 | 1/2007 |

OTHER PUBLICATIONS

International Search Report, PCT/SE2011/050221, Jun. 29, 2011.
Written Opinion of the International Searching Authority, PCT PCT/SE2011/050221, Jun. 29, 2011.
International Search Report, PCT/SE2011/050223, Sep. 7, 2011.
Written Opinion of the International Searching Authority, PCT PCT/SE2011/050223, Sep. 7, 2011.
"L'insertion a force dans les circuits imprimes" Toute L'electronique, Societe Des Editions Radio. Paris, FR, No. 551, Feb. 1, 1990; XP000095549, pp. 34-37. No Translation Available.
International Search Report, PCT/SE2011/050222, Jun. 29, 2011.
Written Opinion of the International Searching Authority, PCT/SE2011/050222, Jun. 29, 2011.
International Preliminary Report on Patentability, PCT/SE2011/050222, Jul. 2, 2013.

\* cited by examiner

CONNECTION PIN AND A METHOD FOR MOUNTING A CONNECTION PIN IN A COMPONENT CARRIER FOR AN ELECTRONIC ASSEMBLY, AND SUCH A COMPONENT CARRIER COMPRISING CONNECTION PINS

CROSS REFERENCE TO RELATED APPLICATION

This application is a 35 U.S.C. §371 national stage application of PCT International Application No. PCT/SE2011/050221, filed on 25 Feb. 2011, the disclosure and content of which is incorporated by reference herein in its entirety. The above-referenced PCT International Application was published in the English language as International Publication No. WO 2012/115554 A1 on 30 Aug. 2012.

TECHNICAL FIELD OF THE INVENTION

The present invention relates to a connection pin and a method for mounting a connection pin in a through-hole provided in a component carrier for an electronic assembly, such as a printed circuit board or the like. The invention also relates to a component carrier for an electronic assembly, comprising connection pins mounted in accordance with the method.

BACKGROUND OF THE INVENTION

In the electronics industry, connection pins are widely used to provide connection between different parts of an electronic assembly. The connection pins are e.g. mounted in a through-hole in a component carrier or they are surface mounted to a component carrier, which component carrier can have different applications and/or combinations thereof, such as: the component carrier can be part of a printed circuit board, it can carry electronic components and form a component board, it can carry modules such as power modules or stackable modules comprising different components, it can be part of a motherboard etc., all of which can form, or be parts or modules of an electronic assembly. The connection pins usually provide both mechanical connection between the parts of the assembly, as well as electrical connection. There exists a number of known assembly techniques for anchoring a connection pin in or to a component carrier, such as wave soldering, surface mounted pin in solder paste, press-fit, rivet/clinching, etc. The chosen technique mostly depends on the application in which the component carrier is used and the requirements involved.

When using a press-fit assembly technique, the component carrier is provided with a through-hole into which an end portion of the connection pin is to be inserted. The through-hole is slightly narrower than the end portion of the connection pin, and the connection pin has to be inserted into the through-hole by force, thereby achieving a press-fit of the connection pin in the through-hole. The interior wall of the through-hole and/or the press-fit portion of the connection pin are subject to deformation. The connection pin may have a press-fit portion that has a special design in order to facilitate deformation. Examples of such connection pins adapted for press-fit are found in WO 2007/008264 and US 2009/0298312.

According to another known assembly technique, the connection pin has an end portion adapted to be inserted in a through-hole in a component carrier, which end portion is slightly narrower than the size of the through-hole. The connection between the connection pin in the through-hole and the component carrier is achieved by dispensing solder paste in the through-hole, or at the opening of the through-hole, and soldering the connection pin to the component carrier.

According to another known assembly technique, the connection pin may be designed as a rivet and will then be anchored to the component carrier by riveting to the connection pin. In order to provide electrical connection between the component carrier and the connection pin, the connection pin is usually also soldered to the component carrier.

In many applications, each connection pin is anchored to a component carrier via one of its ends, and the other end of the connection pin is intended to be mounted on the surface of another module in the electronic assembly, such as another component carrier, a printed circuit board (PCB), a motherboard, a component board, etc. Whenever such surface mounting is used, one important factor is the tolerances between the different parts. For example, the tolerance related to the distance between the end of each pin facing the surface on which it is to be mounted and the surface itself, is crucial if successful mounting is to be achieved. Since the mating surface of the module on which the component carrier with its pins are to be mounted generally has a high degree of planarity or flatness, the corresponding end surfaces of the connection pins must also represent a common surface with a high degree of planarity/flatness, or in other words, a high degree of co-planarity between the end surfaces. However, this can be a problem, often due to the fact that the anchoring of the pins in the through-holes of the component carrier nearly always involves some sort of deformation of the pin in its longitudinal direction, and/or the through-hole and/or the component carrier. If the component carrier is deformed e.g. when riveting a connection pin, this will result in a slightly curved component carrier with deficient planarity and the connection pins anchored in the component carrier will also display a corresponding deficiency of co-planarity of their end surfaces facing the mating surface. If the connection pins are deformed in their longitudinal direction this will affect the flatness/planarity of their end surfaces, both in terms of the individual end surface perhaps not being totally aligned with the intended mating surface, and in terms of the previously referred too common surface represented by the end surfaces of several connection pins, not having the required high degree of co-planarity. Also the assembly technique of soldering the pin in a through-hole can result in lack of sufficient planarity. A typical failure in electronic assemblies as described above occurs when the lack of co-planarity of the connection pins of a mounted device, such as a component carrier, impedes the soldering of an intended mating surface which will result in an air gap and lack of electrical connection between the pin with its device and the mating surface.

SUMMARY OF THE INVENTION

The object of the present invention is to provide an improved connection pin suitable for mounting in a component carrier, and a method therefor.

The object is achieved by means of a connection pin for mounting in a through-hole provided in a component carrier, the connection pin comprising an anchoring part adapted for insertion into said through-hole with a non press fit, a contact part adapted to extend outside said through-hole, and a flange part adapted to abut against said component carrier and located between said anchoring part and said contact part. The connection pin is characterized in that, in the anchoring part is provided an internal cavity and that the anchoring part comprises a wall surrounding the internal cavity, which wall has at least two wall portions forming deformation zones and which wall portions are adapted to be located in the through-hole when the anchoring part is inserted in the through-hole, such that, upon exertion of a force on a free end of the anchoring part of the pin when the anchoring part is inserted in the through-hole, the deformation zones are deformed within the through-hole and thereby achieving a press fit of the connection pin in the through-hole.

The connection pin of the present invention offers the advantage that it can be mounted and anchored in a component carrier with less deformation of the component carrier than in prior art techniques. The force exerted by an anchoring tool, similar to riveting, in order to anchor the pin in the component carrier is only exerted on the end of the anchoring part of the pin, no force is exerted on the component carrier from the tool. Furthermore, the force exerted from the deformation of the anchoring part of the pin in the through-hole, is only exerted in a transverse direction, which means that the risk of having a curving of the component carrier as a result is reduced. The connection pin also offers the advantage that it is suited for use with the method defined according to the present invention.

According to a first embodiment, the deformation zones are formed by providing wall portions having a wall thickness that is less than the thickness of adjacent wall portions. This may be achieved in many ways, for example by having a different cross sectional shape of the internal cavity compared to the external shape of the anchoring part. The internal shape of the anchoring part with its internal cavity may for example be oval while the external shape of the anchoring part is circular, resulting in two wall portions of a thinner cross section, or vice versa; the cross section of the wall may have an internal shape that is rectangular or a quadrant while the external shape is circular, resulting in four wall portions of a thinner cross section, or vice versa; or any other combination of geometrical shapes resulting in wall portions having different wall thicknesses and thus creating deformation zones.

According to a second embodiment, the wall surrounding the internal cavity of the anchoring part is provided with at least two wall openings having a weakening effect on the wall, and thereby the wall displays wall portions forming deformation zones between the openings. Naturally, the number of openings may vary from 2, 3, 4 or more openings, and the shape and exact location of the openings may also vary.

According to a further feature of the connection pin according to the present invention, the internal cavity has an outer opening at the free end of the anchoring part of the pin.

According to yet another feature, the flange part may have a contact side adapted for abutment against the component carrier, wherein the internal cavity has at least one inner opening, adjacent the flange part, wherein said contact side is provided with at least one groove communicating with said inner opening, and wherein the at least one groove stretches from the inner opening to a corresponding groove opening in an external axial surface of the flange part. By means of these features, the advantage is achieved the solder paste may be dispensed into the internal cavity from the outer opening and the solder may then flow from the internal cavity out through the inner opening and into said groove, thus making it possible to solder the connection pin to the component carrier, including soldering to the bottom surface of the component carrier abutting the flange part, by only dispensing solder paste from the upper side of the component carrier into said internal cavity. The solder may even flow to the outside of the flange part, via the groove/grooves and their openings in the axial surface of the flange. The grooves may also serve as degassing channels when the solder is melting.

In particular, with regard to the second embodiment of the connection pin, the internal cavity may have an outer opening at the free end of the anchoring part of the pin, wherein the flange part has a contact side adapted for abutment against the component carrier, wherein the internal cavity has at least one inner opening, adjacent the flange part, communicating with one of the at least two wall openings in the wall surrounding the internal cavity, wherein said contact side is provided with at least one groove communicating with said at least one inner opening, wherein each groove of said at least one groove stretches from one of said at least one inner opening to a corresponding groove opening in an external axial surface of the flange part.

According to any one of the embodiments, the contact side may be provided with two grooves, wherein a first groove stretches across the contact side from a first groove opening to a second groove opening and via a first inner opening, and a second groove stretches across the contact side from a third groove opening to a fourth groove opening via a second inner opening.

In an alternative applicable to any one of the embodiments, the contact side is provided with three grooves and the internal cavity is provided with three inner openings, wherein a first groove stretches across the contact side from a first groove opening to a second groove opening and via a first inner opening, a second groove stretches across the contact side from a third groove opening to a fourth groove opening via a second inner opening, and a third groove stretches across the contact side from a fifth groove opening to a sixth groove opening via a third inner opening.

Naturally, the number of grooves can vary and more than three grooves are conceivable within the scope of the inventive idea, as well as the shape of the grooves may vary and their exact location may vary. For example, it is possible to have grooves that do not extend all the way out to external axial surface of the flange part.

The number and locations of the inner openings may also vary, as well as their shape.

The object of the present invention is also achieved through a method for mounting a connection pin as defined above, in a through-hole provided in a component carrier for an electronic assembly, comprising locating a free contact end of the contact part of the pin in a recess provided in a die tool, inserting the anchoring part of the pin in a through-hole of the component carrier, anchoring the pin in the component carrier by deformation of the anchoring part of the pin, achieved by exerting a force on a free end of the anchoring part of the pin inserted in the through-hole in the component carrier while the free end of the contact part abuts a bottom surface in the recess in the die tool, thereby causing deformation of the deformation zones in an outward direction resulting in a press fit of the anchoring part of the pin in the through-hole.

The advantages offered by this method have already been described above in connection with the connection pin.

The method may further comprise dispensing soldering paste into the internal cavity via the outer opening, and performing a melting operation of the soldering paste, whereby the soldering paste in the internal cavity flows down in the internal cavity and into the grooves on the contact side of the flange of the connection pin, by means of which the contact side of the flange part of the pin is soldered to the component carrier and electrical connection is achieved between the connection pin and the component carrier.

The method may comprise mounting all of the connection pins of a component carrier at the same time by
locating the respective free contact ends of the contact parts of the connection pins in a corresponding recess provided in a die tool,
for each pin, inserting the anchoring part of the pin in a through-hole of the component carrier,
simultaneously anchoring the connection pins in the component carrier by deformation of the anchoring parts of the pins, achieved by simultaneously exerting a force on the free ends of the anchoring parts of the pins inserted in the through-hole in the component carrier while the free ends of the contact parts abuts a respective bottom surface in corresponding recesses in the die tool.

It is naturally an advantage to be able to mount all of the connection pins at the same time. This will speed up the mounting process and save costs.

The method may also comprise dispensing soldering paste into the internal cavity via the outer opening of the respective connection pin, and after having dispensed solder to all of the connection pins of a component carrier, performing a melting operation of the soldering paste, whereby the soldering paste in the internal cavity flows down in the internal cavity and into the grooves on the contact side of the flange of the connection pin, by means of which the contact side of the flange part of each pin is soldered to the component carrier and electrical connection is achieved between the connection pins and the component carrier.

Through this method, and the use of the die tool, is obtained the advantage that all connection pins mounted simultaneously in a component carrier will have contact ends with end surfaces with a high level of co-planarity inbetween them. This will make it possible to reduce the tolerances related to surface mounting of a component carrier, in relation the intended mating surface. For example, when the intended mating surface is the surface of a printed circuit board, the solder layer of the PCB pattern may be made thinner and still a reliable connection can be obtained. A thinner solder layer will also make it possible to surface mount components with lesser distance between the components and also use components with a finer pitch (leg distance).

Finally, according to a third aspect of the present invention is defined a component carrier for an electronic assembly, comprising connection pins mounted in accordance with the defined method.

For clarity reasons it is mentioned that the word component carrier in the present context shall be interpreted to include, but without any limiting effect, a substrate comprising one or more layers and forming a component carrier, or any other type of carrier suitable for mounting electronic components thereon, for printing or otherwise producing circuit patterns on the surface thereof, thereby obtaining a printed circuit board, a motherboard, a component board, or similar, or the substrate/carrier may be used for different applications e.g. carry a power module, memory module, a broadband module, etc.

BRIEF DESCRIPTION OF THE DRAWINGS

A detailed description of the present invention and embodiments thereof, given as examples only, will now be made with reference to the accompanying drawings, in which.

DETAILED DESCRIPTION OF THE INVENTION

Figure 1:
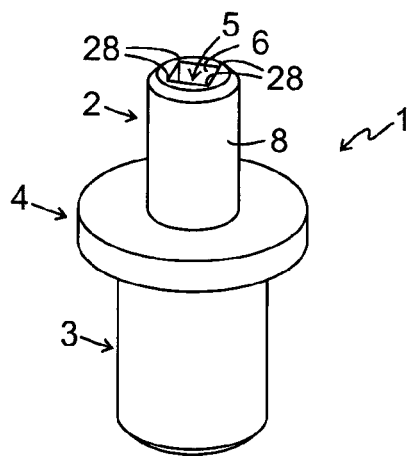
FIG. 1 illustrates schematically a first embodiment of a connection pin according to the present invention.
Figure 2:
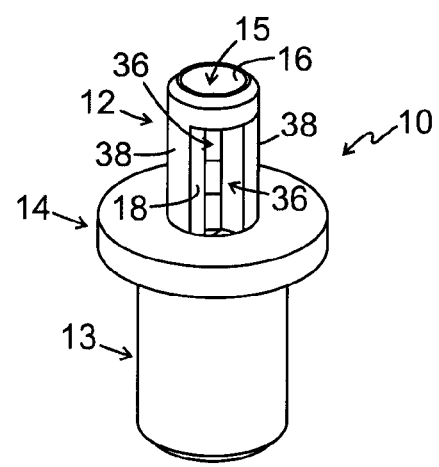
FIG. 2 illustrates schematically a second embodiment of a connection pin according to the present invention.

In FIG. 1 is shown a connection pin 1 according to a first embodiment of the present invention and in FIG. 2 is shown a connection pin 10 according to a second embodiment. In both embodiments, the connection pin comprises an anchoring part 2, 12, adapted for insertion into a through-hole in a component carrier, see FIGS. 7-9, a contact part 3, 13, and a flange part 4, 14 located between the anchoring part and the contact part. In the anchoring part 2, 12 there is provided an internal cavity 5, 15. The cavity has an outer opening 6, 16 at the free end of the anchoring part 2, 12.

The anchoring part 2, 12 has a wall 8, 18 surrounding the internal cavity. The wall has at least two wall portions 28, 38 respectively, forming deformation zones. In the first embodiment illustrated in FIG. 1, the deformations zones are obtained by having wall portions that have a thickness in cross section that is less than the thickness of adjacent wall portions. This may for example be achieved by having different geometrical shape, in cross section, of the internal cavity and the external shape of the anchoring part. In the example illustrated in FIG. 1 and FIG. 4, the external shape of the connection pin is cylindrical. In a radial cross section the internal shape is a quadrant while the external shape is circular, thus resulting in four wall portions 28 having a thickness that is less than the thickness of the adjacent wall portions. Thereby, deformation zones are obtained by the thinner wall portions. Many other combinations of geometrical shapes are conceivable resulting in wall portions having different wall thicknesses and thus creating deformation zones.

Figure 3:
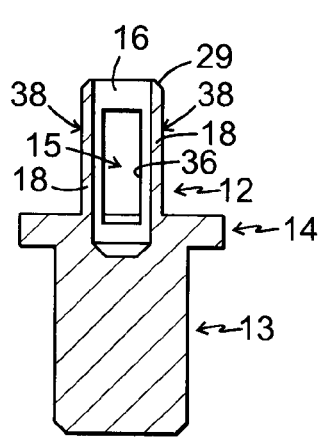
FIG. 3 shows a side view of the connection pin according to the second embodiment, in cross section.

According to a second embodiment of the invention, as illustrated in FIG. 2 and FIG. 3, the deformation zones are achieved by providing at least two wall openings 36 in the wall 18 of the internal cavity 15, thereby weakening the wall portions between the openings and consequently resulting in two wall portions 38 forming the deformation zones. Naturally, the number of openings and the exact location of the openings may vary, as well as the shape of the openings.

Figure 4:
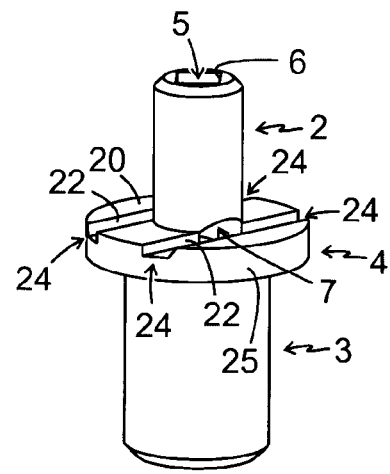
FIG. 4 illustrates schematically a variant of the first embodiment of a connection pin according to the present invention.
Figure 5:
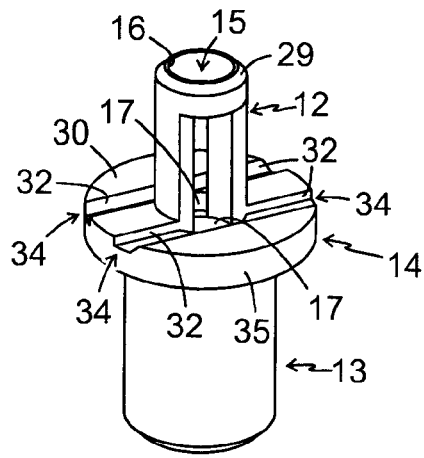
FIG. 5 illustrates schematically a variant of the second embodiment of a connection pin according to the present invention.
Figure 6:
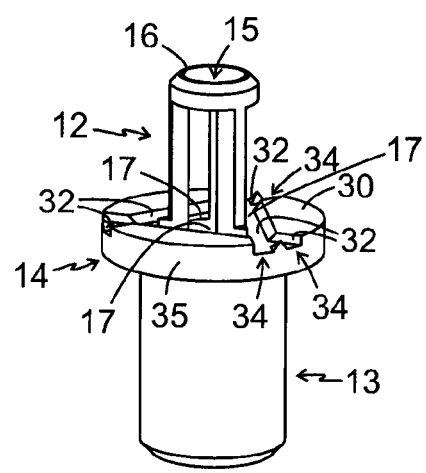
FIG. 6 illustrates schematically another variant of a connection pin according to the present invention.

In the variant illustrated in FIGS. 4-6, the internal cavity 5, 15 is also provided with an inner opening 7, 17 at the opposite end of the anchoring part compared to the outer opening 6, 16, and adjacent to the flange part 4, 14.

Figure 7:
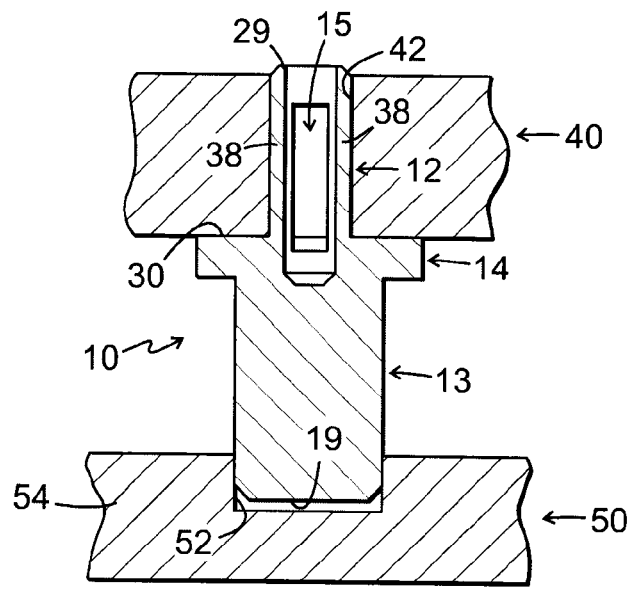
FIGS. 7-9 illustrate steps of the method according to the present invention.
Figure 8:
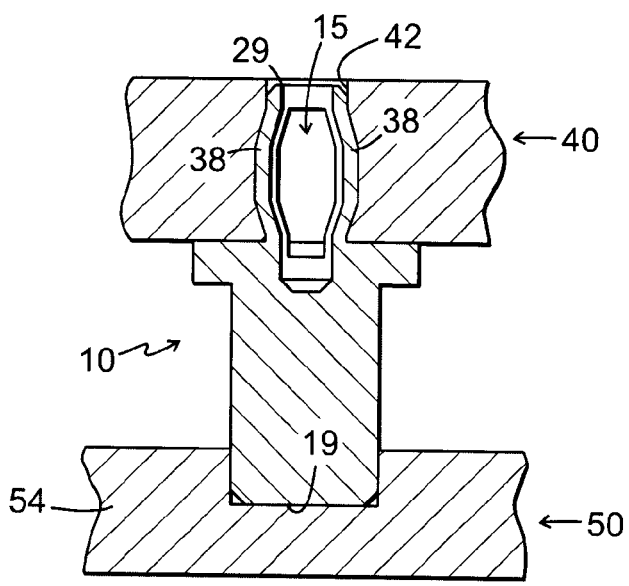
Figure 9:
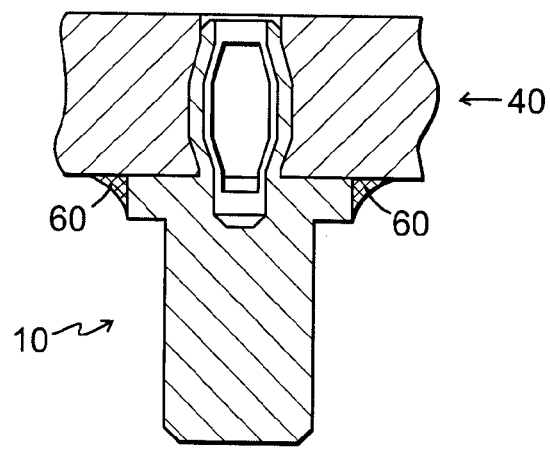

To continue, the flange part 4, 14 has a contact side 20, 30 side adapted for abutment against the component carrier 40, see also FIGS. 7-9. Said contact side is provided with at least one groove 22, 32 communicating with said at least one inner opening 7, 17, wherein each groove 22, 32 of said at least one groove stretches from one of said at least one inner opening 7, 17 to a corresponding groove opening 24, 34 in an external axial surface 25, 35 of the flange part 4, 14.

As illustrated in FIGS. 5 and 6, and according to the second embodiment, the inner opening 17 may communicate with the wall opening 36, or in other words, the wall opening 36 also functions as the inner opening 17 communicating with the grooves 32. However, it would also be conceivable according to the second embodiment to have a wall opening 36 separated from the inner opening 17.

As illustrated in FIGS. 4-6, the number of grooves is two or three. However, the number of grooves may vary, even above three, as may also their shape and exact location. The number of inner openings should preferably correspond to the number of grooves.

Figure 10:
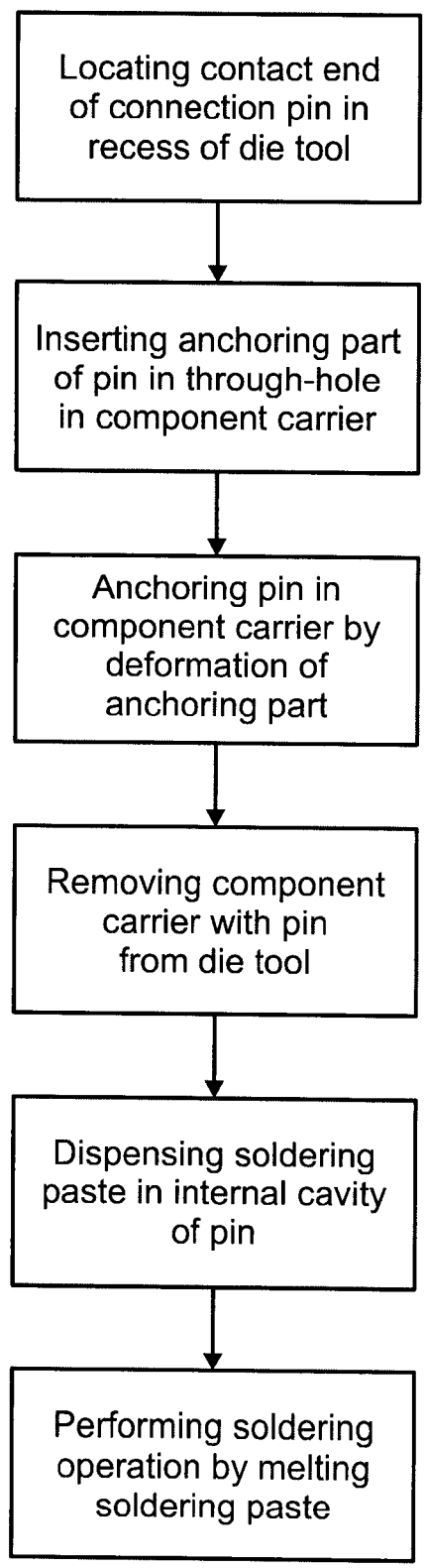
FIG. 10 shows a flow chart illustrating the method according to the present invention.

FIGS. 7-9 mainly serve to illustrate the method according to the present invention. FIG. 10 illustrates the method in a flow chart.

In FIG. 7, is schematically illustrated a connection pin 10, in this example according to the second embodiment of the connection pin, which has been located by the free end 19, or contact end, of its contact part 13 in a recess 52 formed in a plate 54 of a die tool 50. The recess 52 has a depth and shape that is adapted to the shape of the contact end 19 of the connection pin, such that the contact end can easily be located in the recess 52, while at the same time the recess 52 functions as a guiding means for the contact end 19 such that the connection pin 10 is adequately supported in the recess during the anchoring operation of the pin in the component carrier 40.

The connection pin 10 is then inserted in a through-hole 42 of the component carrier 40 by means of the anchoring part 12 of the pin 10.

In FIG. 8 is illustrated the connection pin 10 after having been anchored in the component carrier 40 by exerting a force on a free end 29 of the anchoring part 12 of the pin, which force will also press the end surface of the contact end 19 of the pin to abutment against the bottom surface of the recess 52. When the force is exerted on the free end 29, the deformations zones 38 of the walls of the internal cavity 15 of the connection pin are deformed to a press fit inside the through-hole 42.

The bottom surface of the recess 52 has a high hardness that should be sufficient enough to withstand the force exerted on the pin during anchoring of the pin in the component carrier, without any deformation of the surface. The bottom surface should also have a high degree of flatness/planarity.

In FIG. 9 is illustrated the connection pin 10 after anchoring in the component carrier 40 and after soldering paste has been dispensed in the internal cavity 15, and after the soldering operation when the solder has flowed via the grooves and out through the openings of the grooves, as illustrated by the solder seam 60 in FIG. 9. The connection pin 10 is then both mechanically and electrically connected to the component carrier 40.

This method is also illustrated in the flow chart of FIG. 10, showing the different steps of the method:

Step 1: Locating the free contact end of the contact part of a connection pin in a recess provided in a die tool, Step 2: Inserting the anchoring part of the pin in a through-hole of the component carrier, Step 3: Anchoring the pin in the component carrier by deformation of the anchoring part of the pin, achieved by exerting a force on a free end of the anchoring part of the pin inserted in the through-hole in the component carrier while the free end of the contact part abuts a bottom surface in the recess in the die tool, thereby causing deformation of the deformation zones in an outward direction resulting in a press fit of the anchoring part of the pin in the through-hole.

Step 4: Removing component carrier with connection pin from die tool.

Step 5: Dispensing soldering paste in to the internal cavity of the pin, via the outer opening of the connection pin.

Step 6: Performing a soldering operation by melting the soldering paste.

Step 4 may alternatively be performed between step 5 and step 6.

In FIGS. 9 and 10 the method is illustrated to be performed on one connection pins only. However, according to the present invention, all of the connection pins of a component carrier may be mounted at the same time. This means that in each step the described operation will be performed for all of the connection pins, preferably simultaneously, before continuing to the next step.

The present invention shall not be limited to the illustrated examples and embodiments, but may be modified in many ways within the scope of the appended patent claims, as will be recognized by the person skilled in the art.

The invention claimed is:

1. A connection pin for mounting in a through-hole provided in a component carrier, the connection pin comprising:
an anchoring part adapted for insertion into said through-hole with a non press fit, wherein the anchoring part has an internal cavity and that the anchoring part comprises a wall surrounding the internal cavity, which wall has at least two wall portions forming deformation zones and which wall portions are adapted to be located in the through-hole when the anchoring part is inserted in the through-hole;
a contact part adapted to extend outside said through-hole; and
a flange part adapted to abut against said component carrier and located between said anchoring part and said contact part, wherein the flange part has a contact side adapted for abutment against said component carrier, wherein the internal cavity has at least one inner opening, adjacent the flange part, wherein said contact side is provided with at least one groove communicating with said inner opening, and wherein the at least one groove stretches from the inner opening to a corresponding groove opening in an external axial surface of the flange part,
wherein upon exertion of a force on a free end of the anchoring part of the pin when the anchoring part is inserted in the through-hole, the deformation zones are deformed within the through-hole to press fit the connection pin in the through-hole.

2. The connection pin according to claim 1, wherein the deformation zones comprise at least one wall portion having a wall thickness that is less than the thickness of an adjacent wall portion.

3. The connection pin according to claim 1, wherein the wall surrounding the internal cavity of the anchoring part is provided with at least two wall openings having a weakening effect on the wall, so that the wall displays wall portions forming forms deformation zones between the openings.

4. The connection pin according to claim 3, wherein the internal cavity has an outer opening at the free end of the anchoring part of the pin, wherein the flange part has a contact side adapted for abutment against the component carrier, wherein the internal cavity has at least one inner opening, adjacent the flange part, communicating with one of the at least two wall openings in the wall surrounding the internal cavity, wherein said contact side is provided with at least one groove communicating with said at least one inner opening, wherein each groove of said at least one groove stretches from one of said at least one inner opening to a corresponding groove opening in an external axial surface of the flange part.

5. The connection pin according to claim 1, wherein the internal cavity has an outer opening at the free end of the anchoring part of the pin.

6. The connection pin according to claim 1, wherein the contact side is provided with two grooves, wherein a first groove stretches across the contact side from a first groove opening to a second groove opening and via a first inner opening, and a second groove stretches across the contact side from a third groove opening to a fourth groove opening via a second inner opening.

7. The connection pin according to claim 1, wherein the contact side is provided with three grooves and the internal cavity is provided with three inner openings, wherein a first groove stretches across the contact side from a first groove opening to a second groove opening and via a first inner opening, a second groove stretches across the contact side from a third groove opening to a fourth groove opening via a second inner opening, and a third groove stretches across the contact side from a fifth groove opening to a sixth groove opening via a third inner opening.

8. A method for mounting a connection pin in a through-hole provided in a component carrier for an electronic assembly, the method comprising:
providing a connection pin comprising:
an anchoring part adapted for insertion into said through-hole with a non press fit, wherein the anchoring part has an internal cavity and the anchoring part comprises a wall surrounding the internal cavity, which wall has at least two wall portions forming deformation zones and which wall portions are adapted to be located in the through-hole when the anchoring pm1 is inserted in the through-hole;
a contact part adapted to extend outside said through-hole; and
a flange part adapted to abut against said component carrier and located between said anchoring part and said contact part, wherein the flange part has a contact side adapted for abutment against said component carrier, wherein the internal cavity has at least one inner opening, adjacent the flange part, wherein said contact side is provided with at least one groove communicating with said inner opening, and wherein the at least one groove stretches from the inner opening to a corresponding groove opening in an external axial surface of the flange part,
locating a free contact end of the contact part of the pin in a recess provided in a die tool, inserting the anchoring part of the pin in a through-hole of the component carrier,
anchoring the pin in the component carrier by deformation of the anchoring part of the pin, achieved by exerting a force on a free end of the anchoring pm1 of the pin inserted in the through-hole in the component carrier while the free end of the contact pm1 abuts a bottom surface in the recess in the die tool, thereby causing deformation of the deformation zones in an outward direction resulting in a press fit of the anchoring part of the pin in the through-hole.

9. The method according to claim 8, further comprising dispensing soldering paste into the internal cavity via an outer opening, and performing a melting operation of the soldering paste, whereby the soldering paste in the internal cavity flows down in the internal cavity and into the grooves on the contact side of the flange of the connection pin, so that the contact side of the flange pm1 of the pin is soldered to the component carrier and electrical connection is provided between the connection pin and the component carrier.

10. The method according to claim 8, further comprising mounting all of the connection pins of a component carrier at the same time by
locating the respective free contact ends of the contact parts of the connection pins in a corresponding recess provided in a die tool,
for each pin, inserting the anchoring part of the pin in a through-hole of the component carrier,
simultaneously anchoring the connection pins in the component carrier by deformation of the anchoring parts of the pins, achieved by simultaneously exerting a force on the free ends of the anchoring parts of the pins inserted in the through-hole in the component carrier while the free ends of the contact parts abuts a respective bottom surface in corresponding recesses in the die tool.

11. The method according to claim 10, further comprising dispensing soldering paste into the internal cavity via an outer opening of the respective connection pin, and after having dispensed solder to all of the connection pins of a component carrier, performing a melting operation of the soldering paste, whereby the soldering paste in the internal cavity flows down in the internal cavity and into the grooves on the contact side of the flange of the connection pin, so that the contact side of the flange part of each pin is soldered to the component carrier and electrical connection is provided between the connection pins and the component carrier.

12. A component carrier for an electronic assembly, comprising connection pins mounted in accordance with claim 8.

* * * * *